(12) United States Patent
Zhang

(10) Patent No.: US 10,243,027 B2
(45) Date of Patent: Mar. 26, 2019

(54) DISPLAY PANEL, FABRICATING METHOD THEREOF, AND DISPLAY APPARATUS

(71) Applicant: BOE TECHNOLOGY GROUP CO., LTD, Beijing (CN)

(72) Inventor: Song Zhang, Beijing (CN)

(73) Assignee: BOE TECHNOLOGY GROUP CO., LTD, Beijing (CN)

(*) Notice: Subject to any disclaimer, the term of this patent is extended or adjusted under 35 U.S.C. 154(b) by 8 days.

(21) Appl. No.: 15/500,731

(22) PCT Filed: Jun. 7, 2016

(86) PCT No.: PCT/CN2016/085096
§ 371 (c)(1),
(2) Date: Jan. 31, 2017

(87) PCT Pub. No.: WO2017/032131
PCT Pub. Date: Mar. 2, 2017

(65) Prior Publication Data
US 2017/0229526 A1    Aug. 10, 2017

(30) Foreign Application Priority Data

Aug. 27, 2015    (CN) .................... 2015 1 0536844

(51) Int. Cl.
| H01L 27/32 | (2006.01) |
| H01L 27/30 | (2006.01) |
| H01L 27/12 | (2006.01) |
| H01L 51/00 | (2006.01) |
| H01L 51/52 | (2006.01) |
| H01L 27/01 | (2006.01) |
| H01L 27/02 | (2006.01) |

(52) U.S. Cl.
CPC .......... *H01L 27/3232* (2013.01); *H01L 27/12* (2013.01); *H01L 27/307* (2013.01);
(Continued)

(58) Field of Classification Search
CPC .. H01L 51/5237; H01L 27/32; H01L 51/5256
(Continued)

(56) References Cited

U.S. PATENT DOCUMENTS

| 7,902,755 B2 * | 3/2011 | Kubota | .................. H05B 33/04 |
| | | | 313/504 |
| 2006/0017371 A1 * | 1/2006 | Yamada | .............. H01L 27/3206 |
| | | | 313/498 |

(Continued)

FOREIGN PATENT DOCUMENTS

| CN | 102855816 A | 1/2013 |
| CN | 105206620 A | 12/2015 |
| JP | 2007157374 A | 6/2007 |

OTHER PUBLICATIONS

The World Intellectual Property Organization (WIPO) International Search Report for PCT/CN2016/085096 dated Sep. 14, 2016 p. 1-12.

(Continued)

*Primary Examiner* — David Vu
*Assistant Examiner* — Brandon Fox
(74) *Attorney, Agent, or Firm* — Anova Law Group, PLLC

(57) ABSTRACT

In accordance with various embodiments of the disclosed subject matter, a display panel, a fabricating method thereof, and a related display apparatus are provided. In some embodiments, the display panel comprises: a base substrate comprising a display region and a peripheral region, wherein the peripheral region surrounds the display region; a light emitting device in the display region; a buffer layer on the peripheral region; and a first sealing layer on the buffer layer and the light emitting device.

14 Claims, 3 Drawing Sheets

(52) U.S. Cl.
CPC .......... *H01L 51/00* (2013.01); *H01L 51/0097* (2013.01); *H01L 51/5237* (2013.01); *H01L 51/5253* (2013.01); *H01L 51/5256* (2013.01); *H01L 27/016* (2013.01); *H01L 27/0262* (2013.01); *H01L 27/32* (2013.01); *H01L 2251/5338* (2013.01)

(58) Field of Classification Search
USPC ............................................ 257/40; 313/512
See application file for complete search history.

(56) References Cited

U.S. PATENT DOCUMENTS

| 2010/0320909 | A1* | 12/2010 | Izumi | H01L 27/3246 |
| | | | | 315/51 |
| 2014/0145155 | A1* | 5/2014 | Park | H01L 51/5253 |
| | | | | 257/40 |
| 2014/0167053 | A1* | 6/2014 | Akiyoshi | H01L 27/1262 |
| | | | | 257/59 |
| 2014/0361273 | A1* | 12/2014 | Nozawa | H01L 51/524 |
| | | | | 257/40 |
| 2016/0111677 | A1* | 4/2016 | Hong | H01L 51/5246 |
| | | | | 257/40 |

OTHER PUBLICATIONS

State Intellectual Property Office of the P.R.C (SIPO) Office Action 1 for 201510536844.2 dated Apr. 21, 2016 p. 1-7.

\* cited by examiner

DISPLAY PANEL, FABRICATING METHOD THEREOF, AND DISPLAY APPARATUS

CROSS-REFERENCES TO RELATED APPLICATIONS

This application is a national phase entry under 35 U.S.C. § 371 of International Application No. PCT/CN2016/085096, filed on Jun. 7, 2016, which claims priority to Chinese Patent Application No. 201510536844.2 filed on Aug. 27, 2015. The above enumerated patent applications are incorporated by reference herein in their entirety.

TECHNICAL FIELD

The disclosed subject matter generally relates to display technologies and, more particularly, relates to a display panel, a fabricating method thereof, and a related display apparatus.

BACKGROUND

A flexible display apparatus often includes a light emitting device formed on a flexible substrate, and a thin film encapsulation layer formed for protecting the light emitting device from external moisture and oxygen influences. Since there are many right-angle-corner regions on the edge of the flexible display apparatus, the thin film encapsulation layer may be cracked under stress when the flexible display apparatus is bent. This problem can result in a degradation in water resistance and oxygen resistance of the thin film encapsulation layer, thus affecting the life of the flexible display apparatus.

Accordingly, it is desirable to provide a display panel, a fabricating method thereof, and a related display apparatus to at least partially alleviate one or more problems set forth above and to solve other problems in the art.

BRIEF SUMMARY

In accordance with some embodiments of the disclosed subject matter, a display panel, a fabricating method thereof, and a related display apparatus are provided.

An aspect of the present disclosure provides a display panel, comprising: a base substrate comprising a display region and a peripheral region, wherein the peripheral region surrounds the display region; a light emitting device in the display region; a buffer layer on the peripheral region; and a first sealing layer on the buffer layer and the light emitting device.

In some embodiments, the display panel further comprises a planarization layer on the first sealing layer and a second sealing layer on the planarization layer.

In some embodiments, the buffer layer comprises at least one ring structure; and the at least one ring structure surrounds the display region.

In some embodiments, a thickness range of the buffer layer is 1 µm to 10 nm.

In some embodiments, the display panel further comprises: a first barrier wall in a first side of the peripheral region that is close to the display region, wherein the first barrier wall surrounds the display region.

In some embodiments, the display panel further comprises: a second barrier wall in a second side of the peripheral region that is far from the display region, wherein the second barrier wall surrounds the display region.

In some embodiments, the display panel further comprises: a first barrier wall in a first side of the peripheral region that is close to the display region, wherein the first barrier wall surrounds the display region; and a second barrier wall in a second side of the peripheral region that is far from the display region, wherein the second barrier wall surrounds the display region.

In some embodiments, the first second barrier and the second barrier wall are linear line shaped, wavy line shaped, or fold line shaped.

In some embodiments, a material of the first second barrier or the second barrier wall comprises at least one of $SiN_x$, $SiO_2$, SiC, SiCN, SiCO polymer monomer, and hexamethyldisiloxane.

Another aspect of the present disclosure provides a display apparatus, comprising: a disclosed display panel; and a thin film transistor on the base substrate, wherein the light emitting device is on the thin film transistor.

In some embodiments, the base substrate is a flexible substrate; and the light emitting device is an organic light emitting diode.

In some embodiments, the buffer layer comprises a first ring structure and a second ring structure, wherein: the first ring structure surrounds the display region; the pixel defining layer surrounds the first ring structure; and the second ring structure surrounds the pixel defining layer.

Another aspect of the present disclosure provides a method for fabricating:

a display panel, comprising: forming a base substrate comprising a display region and a peripheral region, wherein the peripheral region surrounds the display region; forming a light emitting device in the display region; forming a buffer layer in the peripheral region; and forming a first sealing layer on the buffer layer and the light emitting device.

In some embodiments, the method for fabricating the display panel further comprises: forming a planarization layer on the first sealing layer; and forming a second sealing layer on the planarization layer.

In some embodiments, forming a buffer layer in the peripheral region further comprises: printing or coating a buffer layer film in the peripheral region; and forming the buffer layer by performing a patterning process on the buffer layer film.

In some embodiments, the method for fabricating the display panel further comprises: forming a first barrier walls on a first side of the peripheral region that is close to the display region wherein the first barrier wall surrounds the display region.

In some embodiments, the method for fabricating the display panel further comprises: forming a second barrier walls on a second side of the peripheral region that is far from the display region, wherein the second barrier wall surrounds the display region.

In some embodiments, the method for fabricating the display panel further comprises: forming a first barrier wall on a first side of the peripheral region that is close to the display region, wherein the first barrier wall surrounds the display region; and forming a second barrier wall on a second side of the peripheral region that is far from the display region, wherein the second barrier wall surrounds the display region.

In some embodiments, the first second barrier and the second barrier wall are formed by using at least one material from $SiN_x$, $SiO_2$, SiC, SiCN, SiCO, polymer monomer, and hexamethyldisiloxane.

In some embodiments, forming a light emitting device in the display region further comprises: forming an organic light emitting diode in the display region of the base substrate, wherein the base substrate is a flexible substrate.

Other aspects of the present disclosure can be understood by those skilled in the art in light of the description, the claims, and the drawings of the present disclosure.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements. It should be noted that the following drawings are merely examples for illustrative purposes according to various disclosed embodiments and are not intended to limit the scope of the present disclosure.

DETAILED DESCRIPTION

For those skilled in the art to better understand the technical solution of the disclosed subject matter, reference will now be made in detail to exemplary embodiments of the disclosed subject matter, which are illustrated in the accompanying drawings. Wherever possible, the same reference numbers will be used throughout the drawings to refer to the same or like parts.

In accordance with various embodiments, the disclosed subject matter provides a display panel, a fabricating method thereof, and a related display apparatus.

Figure 1:
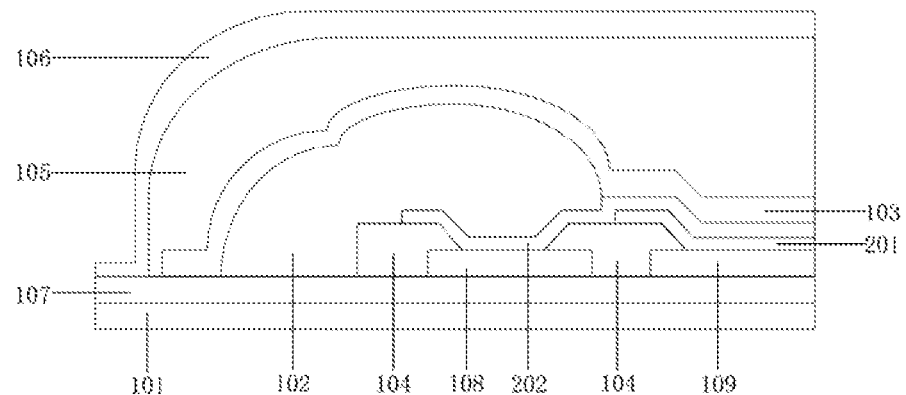
FIG. 1 is a schematic sectional view diagram of a display panel in accordance with some embodiments of the disclosed subject matter.

Referring to FIG. 1, a schematic sectional view diagram of a display panel is shown in accordance with some embodiments of the disclosed subject matter. The display panel comprises a thin film encapsulation structure used for encapsulating a light emitting device.

As illustrated, the thin film encapsulation structure can include a base substrate 101, a buffer layer 102, and a first sealing layer 103.

In some embodiments, the base substrate 101 includes a display region and a peripheral region. The peripheral region surrounds the display region.

A pixel defining layer 104 is disposed between the display region and the peripheral region. The light emitting device is disposed in the display region. The buffer layer 102 is disposed in the peripheral region. The first sealing layer 103 is disposed on the buffer layer 102 and the light emitting device.

Since the peripheral region includes many right-angle-corner structures, the peripheral region is not flat. The first sealing layer 103 includes one or more curved structures rather than right-angle-corner structures in the peripheral region. So the stress on the first sealing layer 103 in the peripheral region can be reduced to avoid cracking the first sealing layer 103 in the peripheral region caused by a too large stress. Therefore, the life of the display apparatus can be prolonged.

In some embodiments, the thin film encapsulation structure further includes a planarization layer 105 and a second sealing layer 106. The planarization layer 105 is disposed on the first sealing layer 103, the second sealing layer 106 is disposed on the planarization layer 105. Including a buffer layer, a planarization layer, and two sealing layers, the thin film encapsulation structure can have a better sealing function.

In some embodiments, the buffer layer 102 can have a thickness ranging from 1 μm to 10 μm. The material constituting the buffer layer 102 can include a polymer monomer material, a polyimide material or a polymethacrylate material.

As illustrated in FIG. 1, a thin film transistor array layer 107 is disposed on the base substrate 101. A cathode lead 108, the pixel defining layer 104, and an anode 109 of an organic light emitting diode are disposed on the thin film transistor array layer 107.

The pixel defining layer 104 includes two parts, one part is located outside of the cathode lead 108, the other part is located between the cathode lead 108 and the anode 109.

An organic light emitting layer 201 of the organic light emitting diode is disposed on the anode 109. A cathode 202 of the organic light emitting diode is disposed on the cathode lead 108, the pixel defining layer 104, and the organic light emitting layer 201. The cathode 202 is connected with drain electrode of thin film transistor through the cathode lead 108.

Figure 2:
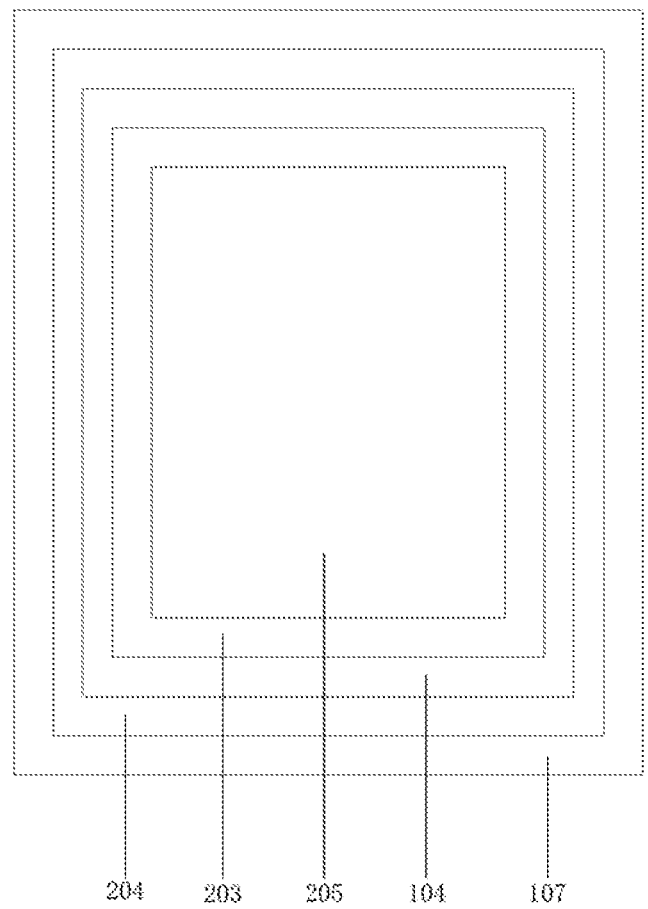
FIG. 2 is a schematic top view diagram of the display panel illustrated in FIG. 1.

Referring to FIG. 2, a schematic top view diagram of the display panel illustrated in FIG. 1 is shown.

The buffer layer 102 includes at least one ring structure surrounding the display region. In some embodiments, the buffer layer 102 includes a first ring structure 203 and a second ring structure 204. Specifically, the first ring structure 203 surrounds the display region 205, the pixel defining layer 104 surrounds the first ring structure 203, the second ring structure 204 surrounds the pixel defining layer 104, and an epitaxial portion of the thin film transistor array layer 107 surrounds the second ring structure 204.

The disclosed display panel can comprises: a base substrate including a display region and a peripheral region, wherein the peripheral region surrounds the display region a light emitting device in the display region; a buffer layer on the peripheral region; and a first sealing layer on the buffer layer and the light emitting device. In the disclosed subject matter, the light emitting device is set in the display region, the buffer layer is set on the peripheral region, and the first sealing layer is set on the buffer layer and the light emitting device, so that the right-angle-corner structures on the first sealing layer in the peripheral region can be eliminated, thereby the stress on the first sealing layer in the peripheral region can be reduced to avoid cracking the first sealing layer in the peripheral region caused by a too large stress, and finally the life of the display apparatus can be prolonged.

Figure 3:
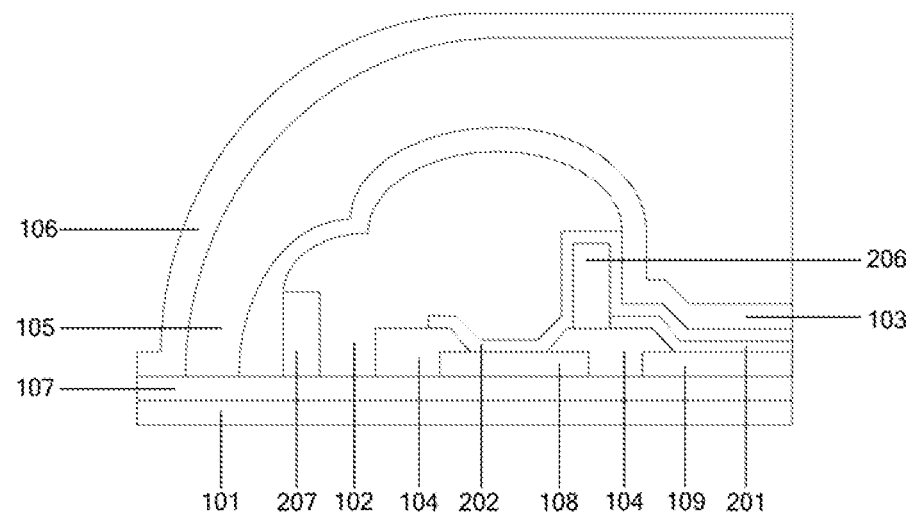
FIG. 3 is a schematic sectional view diagram of a display panel in accordance with some other embodiments of the disclosed subject matter.

Referring, to FIG. 3, a schematic sectional view diagram of a display panel is shown in accordance with some other embodiments of the disclosed subject matter. The display panel comprises a thin film encapsulation structure used for encapsulating a light emitting device.

As illustrated, the thin film encapsulation structure can include a base substrate 101, a buffer layer 102, and a first sealing layer 103.

In some embodiments, the base substrate 101 includes a display region and a peripheral region. The peripheral region surrounds the display region.

A pixel defining layer 104 is disposed between the display region and the peripheral region. The light emitting device is disposed in the display region. The buffer layer 102 is disposed in the peripheral region. The first sealing layer 103 is disposed on the buffer layer 102 and the light emitting device.

Since the peripheral region includes many right-angle-corner structures, the peripheral region is not flat. The first sealing layer 103 includes one or more curved structures rather than right-angle-corner structures in the peripheral region. So the stress on the first sealing layer 103 in the peripheral region can be reduced to avoid cracking the first sealing layer 103 in the peripheral region caused by a too large stress. Therefore, the life of the display apparatus can be prolonged.

In some embodiments, the thin film encapsulation structure further includes a first barrier wall 206. The first barrier wall 206 is disposed in one side of the peripheral region that is close to the display region. The first barrier wall 206 surrounds the display region.

In some embodiments, the thin film encapsulation structure further includes a second barrier wall 207. The second barrier wall 207 is disposed in another side of the peripheral region that is far from the display region. The second barrier wall 207 surrounds the display region.

In some embodiments, the thin film encapsulation structure can include both the first barrier wall 206 and the second barrier wall 207. The first barrier wall 206 and the second barrier wall 207 can be used for preventing an overflowing of the material of the buffer layer 102, and thereby protecting the narrow border.

In some embodiments, the first barrier walls 206 and the second barrier wall 207 can have any suitable shape, such as linear line shape, wavy line shape, fold line shape, etc. The first barrier walls 206 and the second barrier wall 207 can be constituted by any suitable material, such as SiNx, SiO$_2$, SiC, SiCN, SiCO, polymer monomer, Hexamethyldisiloxane (HMDSO), or one or more combinations thereof.

As illustrated in FIG. 3, a thin film transistor array layer 107 is disposed on the base substrate 101. A cathode lead 108, the pixel defining layer 104, and an anode 109 of an organic light emitting diode are disposed on the thin film transistor array layer 107.

The pixel defining layer 104 includes two parts, one part is located outside of the cathode lead 108, the other part is located between the cathode lead 108 and the anode 109.

An organic light emitting layer 201 of the organic light emitting diode is disposed on the anode 109. A cathode 202 of the organic light emitting diode is disposed on the cathode lead 108, the pixel defining layer 104, and the organic light emitting layer 201. The cathode 202 is connected with drain electrode of thin film transistor through the cathode lead 108.

Figure 4:
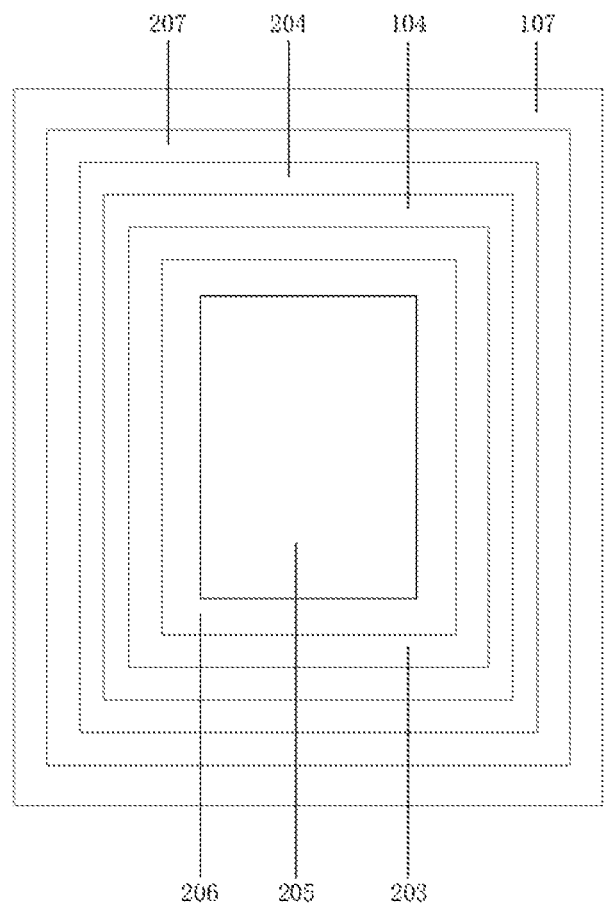
FIG. 4 is a schematic top view diagram of the display panel illustrated in FIG. 3.

Referring to FIG. 4, a schematic top view diagram of the display panel illustrated in FIG. 3 is shown.

The buffer layer 102 includes at least one ring structure surrounding the display region. In some embodiments, the buffer layer 102 includes a first ring structure 203 and a second ring structure 204. Specifically, the first barrier wall 206 surrounds the display region 205, the first ring structure 203 surrounds the first barrier wall 206, the pixel defining layer 104 surrounds the first ring structure 203, the second ring structure 204 surrounds the pixel defining layer 104, the second barrier wall 207 surrounds the second ring structure 204, and an epitaxial portion of the thin film transistor array layer 107 surrounds the second barrier wall 207.

The disclosed display panel can comprises: a base substrate including a display region and a peripheral region, wherein the peripheral region surrounds the display region; a light emitting device in the display region; a buffer layer on the peripheral region; and a first sealing layer on the buffer layer and the light emitting device. In the disclosed subject matter, the light emitting device is set in the display region, the buffer layer is set on the peripheral region, and the first sealing layer is set on the buffer layer and the light emitting device, so that the right-angle-corner structures on the first sealing layer in the peripheral region can be eliminated, thereby the stress on the first sealing layer in the peripheral region can be reduced to avoid cracking the first sealing layer in the peripheral region caused by a too large stress, and finally the life of the display apparatus can be prolonged.

Figure 5:
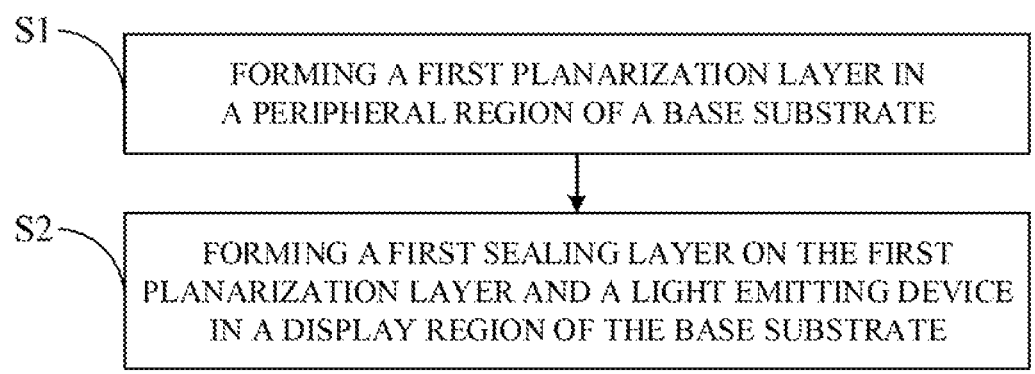
FIG. 5 is a flowchart of a method for fabricating a display panel in accordance with some other embodiments of the disclosed subject matter.

Referring to FIG. 5, a flowchart of a method for fabricating a display panel is shown in accordance with some other embodiments of the disclosed subject matter. The display panel comprises a thin film encapsulation structure used for encapsulating a light emitting device.

The display panel can include a base substrate including a display region and a peripheral region. The peripheral region surrounds the display region. The light emitting device is disposed in the display region.

As illustrated, the method can include:

Step S1: forming a buffer layer in the peripheral region.

In some embodiments, step S1 can include: printing or coating a buffer layer film in the peripheral region, and forming the buffer layer by performing a patterning process on the buffer layer film.

In some embodiments, prior to the step S1, the method can include forming one or more barrier walls in the edge area. The one or more barrier walls can surround the display region.

For example, a first barrier wall can be formed on one side of the peripheral region that is close to the display region. The first barrier wall surrounds the display region.

As another example, a second barrier wall can be formed on another side of the peripheral region that is fin from the display region. The second barrier wall surrounds the display region.

In some embodiments, the first barrier wall and the second barrier wall can both be formed. The first barrier wall and the second barrier wall are used for preventing an overflowing of the material of the buffer layer, and thereby protecting the narrow border.

Step S2: forming a first sealing layer on the buffer layer and the light emitting device.

Since the peripheral region includes many right-angle-corner structures, the peripheral region is not flat. The first sealing layer includes one or more curved structures rather than right-angle-corner structures in the peripheral region. So the stress on the first sealing layer 103 in the peripheral region can be reduced to avoid cracking the first sealing layer in the peripheral region caused by a too large stress. Therefore, the life of the display apparatus can be prolonged.

In some embodiments, the method further includes forming a planarization layer on the first sealing layer, and forming a second sealing, layer on the planarization layer. Including a buffer layer, a planarization layer and two sealing layers, the thin film encapsulation structure can have a better sealing function.

Specifically, a thin film transistor array layer can be formed on the base substrate. A cathode lead, a pixel defining layer, and an anode of an organic light emitting diode can be formed on the thin film transistor array layer.

The pixel defining layer can include two parts, one part is located outside of the cathode lead, the other part is located between the cathode lead and the anode.

An organic light emitting layer of the organic light emitting diode can be formed on the anode. A cathode of the organic light emitting diode can be formed on the cathode lead, the pixel defining layer, and the organic light emitting layer. The cathode can be connected with the drain electrode of thin film transistor through the cathode lead.

In the disclosed method for forming a display panel, the display panel can comprises: a base substrate including a display region and a peripheral region, wherein the peripheral region surrounds the display region; a light emitting device in the display region; a buffer layer on the peripheral region; and a first sealing layer on the buffer layer and the light emitting device. In the disclosed subject matter, the light emitting device is set in the display region, the buffer layer is set on the peripheral region, and the first sealing layer is set on the buffer layer and the light emitting device, so that the right-angle-corner structures on the first sealing layer in the peripheral region can be eliminated, thereby the stress on the first sealing layer in the peripheral region can be reduced to avoid cracking the first sealing layer in the peripheral region caused by a too large stress, and finally the life of the display apparatus can be prolonged.

Another aspect of the disclosed subject matter provides a display apparatus, including a thin film transistor, a light emitting device, and any one of the display panel described above.

In some embodiments, the thin film transistor is disposed on a base substrate, and the light emitting device is disposed on the thin film transistor.

The disclosed display apparatus includes a display panel comprising: a base substrate including a display region and a peripheral region, wherein the peripheral region surrounds the display region; a light emitting device in the display region; a buffer layer on the peripheral region; and first sealing layer on the buffer layer and the light emitting device. In the disclosed subject matter, the light emitting device is set in the display region, the buffer layer is set on the peripheral region, and the first sealing layer is set on the buffer layer and the light emitting device, so that the right-angle-corner structures on the first sealing layer in the peripheral region can be eliminated, thereby the stress on the first sealing layer in the peripheral region can be reduced to avoid cracking the first sealing layer in the peripheral region caused by a too large stress, and finally the life of the display apparatus can be prolonged.

The display apparatus can be any suitable device or component that has a display function, such as a LCD panel, an electronic paper, a mobile phone, a tablet computer, a television, a monitor, a notebook computer, a digital picture frame, a navigation system, a smart watch, etc.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Accordingly, a display panel, a fabricating method thereof, and a related display apparatus are provided.

Although the disclosed subject matter has been described and illustrated in the foregoing illustrative embodiments, it is understood that the present disclosure has been made only by way of example, and that numerous changes in the details of embodiment of the disclosed subject matter can be made without departing from the spirit and scope of the disclosed subject matter, which is only limited by the claims which follow. Features of the disclosed embodiments can be combined and rearranged in various ways. Without departing from the spirit and scope of the disclosed subject matter, modifications, equivalents, or improvements to the disclosed subject matter are understandable to those skilled in the art and are intended to be encompassed within the scope of the present disclosure.

What is claimed is:

1. A display panel, comprising:
   a base substrate comprising a display region and a peripheral region, wherein the peripheral region surrounds the display region;
   a light emitting device in the display region;
   a buffer layer in the peripheral region, the buffer layer including a first ring structure and a second ring structure;
   a first sealing layer on the buffer layer and the light emitting device; and
   a first barrier wall in a first side of the peripheral region that is far from the display region,
   wherein:
      the first ring structure and the first barrier wall surround the display region,
      a pixel defining layer surrounds the first ring structure, and
      the second ring structure surrounds the pixel defining layer.

2. The display panel of claim 1, further comprising:
   a planarization layer on the first sealing layer; and
   a second sealing layer on the planarization layer.

3. The display panel of claim 1, wherein:
   a thickness range of the buffer layer is 1 µm to 10 µm.

4. The display panel of claim 1, further comprising:
   a second barrier wall in a second side of the peripheral region that is close to the display region, wherein the second barrier wall surrounds the display region.

5. The display panel of claim 4, wherein:
   the first barrier wall and the second barrier wall are linear line shaped, wavy line shaped, or fold line shaped.

6. The display panel of claim 4, wherein:
   a material of the first barrier wall or the second barrier wall comprises at least one of $SiN_x$, $SiO_2$, SiC, SiCN, SiCO, polymer monomer, or hexamethyldisiloxane.

7. The display panel of claim 1, further comprising:
   a thin film transistor on the base substrate,
   wherein the light emitting device is on the thin film transistor.

8. The display panel of claim 7, wherein:
   the base substrate is a flexible substrate; and
   the light emitting device is an organic light emitting diode.

9. A method for fabricating a display panel, comprising:
   forming a base substrate comprising a display region and a peripheral region, wherein the peripheral region surrounds the display region;
   forming a light emitting device in the display region;
   forming a buffer layer in the peripheral region, the buffer layer including a first ring structure and a second ring structure;
   forming a first sealing layer on the buffer layer and the light emitting device; and
   forming a first barrier wall on a first side of the peripheral region that is far from the display region, wherein:
the first ring structure and the first barrier wall surround the display region, respectively,
a pixel defining layer surrounds the first ring structure, and
the second ring structure surrounds the pixel defining layer.

10. The method for fabricating the display panel of claim 9, further comprising:
forming a planarization layer on the first sealing layer; and
forming a second sealing layer on the planarization layer.

11. The method for fabricating the display panel of claim 9, wherein forming the buffer layer in the peripheral region comprises:
printing or coating a buffer layer film in the peripheral region; and
forming the buffer layer by performing a patterning process on the buffer layer film.

12. The method for fabricating the display panel of claim 9, further comprising:
forming a second barrier wall on a second side of the peripheral region that is close to the display region, wherein the second barrier wall surrounds the display region.

13. The method for fabricating the display panel of claim 12, wherein the first barrier wall and the second barrier wall are formed by using at least one material from SiNx, $SiO_2$, SiC, SiCN, SiCO, polymer monomer, or hexamethyldisiloxane.

14. The method for fabricating the display panel of claim 9, wherein forming the light emitting device in the display region comprises:
forming an organic light emitting diode in the display region of the base substrate, wherein the base substrate is a flexible substrate.

* * * * *